(12) United States Patent
Kuo

(10) Patent No.: US 6,980,047 B1
(45) Date of Patent: Dec. 27, 2005

(54) LOW POWER HIGH VOLTAGE RAMP-UP CONTROL CIRCUIT

(75) Inventor: Cheng-Hsiung Kuo, Tainan (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 595 days.

(21) Appl. No.: 10/177,856

(22) Filed: Jun. 20, 2002

(51) Int. Cl.[7] .......................... G05F 1/575; G05F 1/563
(52) U.S. Cl. ...................... 327/537; 327/544; 365/227
(58) Field of Search .............................. 327/134, 170, 327/530, 535, 537, 538, 540, 542, 543, 544; 365/189.09, 227

(56) References Cited

U.S. PATENT DOCUMENTS

| | | | |
|---|---|---|---|
| 4,488,060 A | 12/1984 | Simko | .................. 327/170 |
| 5,365,121 A | 11/1994 | Morton et al. | .............. 327/170 |
| 5,408,133 A | 4/1995 | Honnigford et al. | ........ 327/134 |
| 5,872,733 A | 2/1999 | Buti et al. | ............. 365/185.19 |
| 5,986,936 A * | 11/1999 | Ravazzini | .............. 365/185.19 |

* cited by examiner

*Primary Examiner*—Timothy P. Callahan
*Assistant Examiner*—Terry L. Englund
(74) *Attorney, Agent, or Firm*—George O. Saile; Stephen B. Ackerman

(57) ABSTRACT

A circuit, and a method, provide low power high voltage ramp-up control for on-chip semiconductor power supplies, efficiently generating on-chip high voltage to support programming of electrically erasable programmable read only memories, EEPROMs or flash memory. The on-chip efficiency is achieved by eliminating output leakage. In addition, a feedback-controlled transistor is utilized to slow down the frequency required from a current controlled oscillator stage, and to provide the on-chip high voltage with low power dissipation.

32 Claims, 2 Drawing Sheets

LOW POWER HIGH VOLTAGE RAMP-UP CONTROL CIRCUIT

BACKGROUND OF THE INVENTION

1. Field of the Invention

The present invention generally relates to high voltage on-chip circuitry for electrically erasable programmable read-only memory EEPROMs or flash memory. More particularly a low power, high-voltage ramp-up rate control circuit is described which utilizes a current reference, a current controlled oscillator, a charge pump, a feedback transistor, a reference transistor, and a ramp-up transistor.

2. Description of the Prior Art

FIG. 1 contains a circuit schematic which shows the prior art implementation of a ramp-up rate control circuit. A functional block labeled charge pump+oscillator+current reference 110 is shown. The output of this block 110 is a charge pump current, Icp 170. In addition, the voltage on the output node 195 of this block 110 is HV. (High Voltage). A reference current, Iref, 120 is developed in a current source. This current flows into the drain of an N-channel metal oxide semiconductor field effect transistor, NMOS FET, M1 130. The gate 175 of FET M1 130 is connected to its drain. The source of FET M1 is connected to ground 185.

The ramp current Ir 190 flows into the drain 165 of NMOS FET M2 140. The gate of FET M2 140 is connected in common to the gate of FET M1 175. The source of FET M2 is connected to ground 185. The drain 165 of FET M2 is connected to the gate of NMOS FET M3 150. The drain 180 of FET M3 150 receives the leaking current Ileak. The source of FET M3 is tied to ground 185.

In this prior art circuit in FIG. 1, the leak transistor M3 150 will tend to discharge the charge pump output node HV 195. The leakage current Ileak 180 depends on the gate voltage V1 165 of FET M3 150. The ramp-up rate (dV/dt) is equal to Ir/C where C is the capacitance of the capacitor 160 and V is the voltage across capacitor C. In FIG. 1, the leakage path will consume the extra current Ileak. If this extra leakage path 180 can be eliminated, then the power consumption can also be reduced.

U.S. Pat. No. 4,488,060 (Simko) "High Voltage Ramp Rate Control Systems" describes high voltage ramp rate control systems. These systems are useful for on-chip EEPROM high voltage power supplies.

U.S. Pat. No. 5,872,733 (Buti et al.) "Ramp-Up Rate Control Circuit for Flash Memory Charge Pump" describes a ramp-up rate control circuit. This circuit controls the ramp-up rate of a charge pump having an output which provides an output voltage and an output current.

U.S. Pat. No. 5,408,133 (Honnigford et al.) "Ramp Control Circuit" discloses an apparatus for providing an EEPROM programming signal.

U.S. Pat. No. 5,365,121 (Morton et al.) "Charge Pump with Controlled Ramp Rate" discloses a charge pump with a controlled ramp rate. It is made up of a charge pump, a differentiator circuit and a trigger circuit.

SUMMARY OF THE INVENTION

It is therefore an object of the present invention to provide a circuit and a method for providing a low power, high voltage ramp-up rate control circuit. It is further an object of this invention to remove the leakage path from the charge pump output stage that is normally present in the prior art. It is also further an object of this invention to use a feedback-controlled transistor to slow down the required frequency of the current controlled oscillator.

This invention can be achieved with a low power, high voltage ramp-up control made up of a current reference, a current controlled oscillator, a charge pump, a signal adder, a discharge n-channel metal oxide semiconductor field effect, NMOS FET, M3 for the feedback path, a ramp capacitor, a ramp discharge NMOS FET M2, a reference current source, and a reference NMOS FET M1 as shown in FIG. 2. This low power, high voltage ramp-up control circuit contains a constant reference current, Iconst which is developed by the constant current source. The low power, high voltage ramp-up control circuit also contains an oscillator current, Iosc which is developed in the current adder circuit. The low power, high voltage ramp-up control circuit also has a feedback current, Ifb which is developed in said current adder circuit. The low power, high voltage ramp-up control circuit also has a clock signal CLK which is developed by the current controlled oscillator. The low power, high voltage ramp-up control circuit is further made up of a high voltage signal HV which is developed by the charge pump.

This ramp-up control circuit is also made up of a ramp current, Ir developed through the ramp capacitor and the ramp discharge NMOS FET M2. The circuit of this invention is also made up of a reference current, Iref developed in a current source and flowing through the reference NMOS FET M1. The low power, high voltage ramp-up control circuit is also made up of a reference voltage, V1 developed at the drain of the NMOS FET M2. The ramp-up control circuit has a current reference which has an output called constant current, Iconst, which feeds an adder circuit. This adder circuit has one output called oscillator current, Iosc, which feeds a current controlled oscillator circuit and another output called feedback current, Ifb, which feeds the drain of the NMOS FET, M3. The low power, high voltage ramp-up control circuit has a current controlled oscillator which has a clock output, CLK, which drives the charge pump. The charge pump has a high voltage output, HV, which drives one side of said capacitor, C. There is an NMOS FET, M3 which has its drain connected to an output of the adder circuit, its source connected to ground, and its gate connected to the drain of the NMOS FET, M2. The NMOS FET, M2 has its drain connected to one side of said capacitor, C, its source connected to ground, and its gate connected to the gate and drain of the NMOS FET, M1. The NMOS FET, M1 has its drain connected to its gate and to the Iref current source, its source connected to ground and its gate connected to its drain.

The above and other objects, features and advantages of the present invention will be better understood from the following detailed description taken in conjunction with the accompanying drawings.

DESCRIPTION OF THE PREFERRED EMBODIMENT

Figure 2:
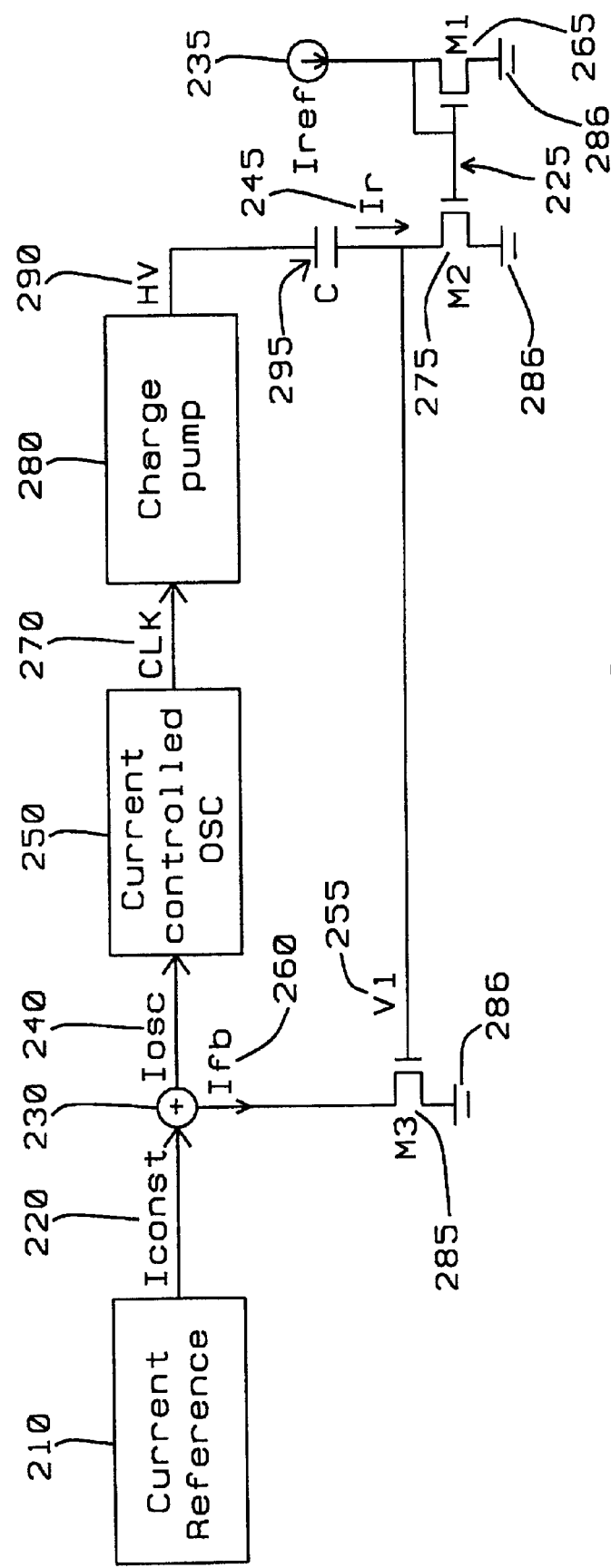
FIG. 2 is a diagram of a circuit which describes the main embodiment of this invention.

In FIG. 2, the main embodiment of this invention is shown. A current reference 210 provides a constant current output, Iconst 220. This constant current source 210 is implemented as is known in the art. This constant current is inputted to an adder 230. The output of the adder 230 is an oscillator current, Iosc 240 and a feedback current, Ifb 260. The feedback current, Ifb flows into the drain of NMOS FET M3 285. The source of FET M3 is connected to ground 286. The gate of FET M3 is tied to voltage V1 255.

The oscillator current, Iosc 240 goes into the current controlled oscillator 250 implemented as is known in the art. The level of Iosc current produces different frequency clocks 270. The oscillator signal CLK 270 goes into the charge pump 280 which is implemented as is known in the art.

The output of the charge pump is the high voltage node HV 290. The HV node 290 is connected to one side of the capacitor, C 295. The other side of the capacitor C 295 is connected to the drain 245 of FET M2 275. The ramp current, Ir flows into the drain of FET M2 275. The source of FET M2 275 is connected to ground 286. The gate of FET M2 is connected to the gate 225 of FET M1 265. The gate of FET M1 265 is also connected to the drain of FET M1 265. The source of FET M1 is connected to ground 286. A current source 235 generates a reference current, Iref, which flows into the drain of FET M1 265.

In FIG. 2, Iconst 220 is the output current of the current reference 210. Iosc 240 is the input current of the current controlled oscillator 250. CLK 270 is the input clock of the charge pump 280. The clock frequency is controlled by Iosc 240. Ifb 260 is the drain current of FET M3 285 which is used as a feedback controlled transistor. The feedback current Ifb 260 depends on the gate voltage V1 255 of FET M3 285. If V1 255 becomes higher, then Ifb 260 becomes larger. According to Iosc=Iconst−Ifb, Iosc will become smaller. The smaller Iosc will result in a slower clock frequency. Because the clock frequency is proportional to Iosc and the power consumption of the charge pump is also proportional to the clock frequency, the circuit and method of this invention can automatically slow down the frequency. The circuit and method of this invention can achieve power reduction.

The implementation of the main embodiment of this invention shown in FIG. 2 is illustration using three NMOS FETs. The circuit of FIG. 2 can also be implemented using PMOS FETs.

The circuit and method of this invention provide a way of efficiently generating on-chip high voltage to support the programming of electrically erasable programmable read only memories, EEPROMs or flash memory. The high voltage needed to program and erase EEPROMs on chip is the HV voltage shown in FIG. 2. The rate of achieving a high voltage on chip is called the ramp-up rate. The ramp-up rate (dV/dt) is equal to Ir/C where C is the capacitance of the capacitor 160 and V is the voltage across the capacitor C. This voltage V across the capacitor C is equal to HV 290 minus the voltage drop of the turned ON NMOS FET M2 275. The ramp-up rate is important for two reasons. The switching time from normal EEPROM or flash memory READ mode to PROGRAM or ERASE mode may be important in certain applications. Secondly, the ramp-up rate is an important indicator of on-chip power dissipation. The slower the ramp-up rate, the lower the power dissipation.

Figure 1:
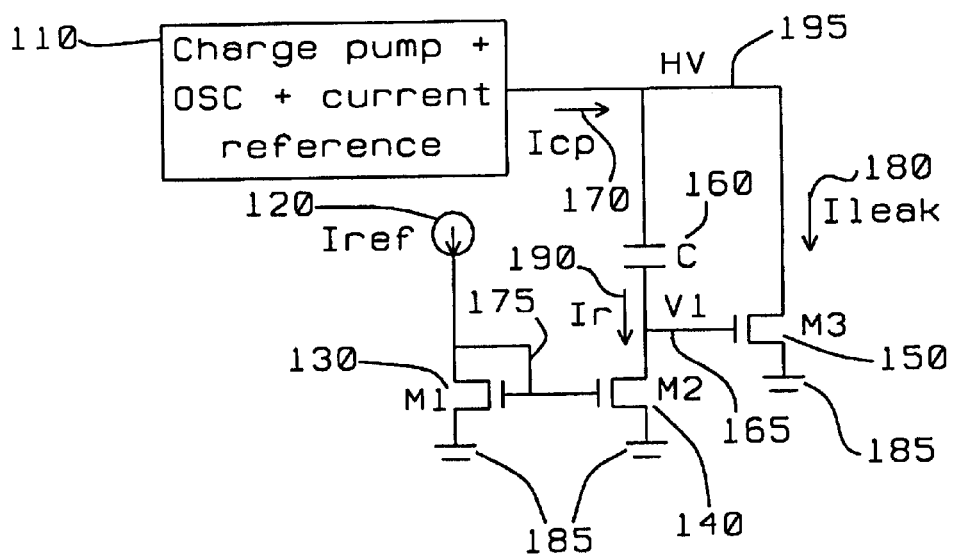
FIG. 1 shows a circuit diagram of a prior art ramp-up rate control circuit.

One method of increasing the on-chip efficiency is achieved by eliminating the traditional output leakage stage of the prior art. This power consuming leakage stage which is eliminated in the main embodiment of this invention is shown in FIG. 1. The leakage path that is eliminated includes NMOS FET device M3 150.

A second power method of reducing power dissipation relates to the following. This invention utilizes a feedback controlled transistor to slow down the frequency required from the current controlled oscillator stage. Voltage V1 255 will increase with increasing frequency at node HV 290. If V1 increases, then Ifb, the feedback current will increase through NMOS FET M3. According to the equation, $$Iosc=Iconst-Ifb, \text{ if Ifb increases,}$$

Iosc will decrease. The lower Iosc will result in a lower output frequency coming out of the current controlled oscillator 250. The power consumption in the charge pump circuitry 280 is proportional to clock frequency.

Therefore, a decreasing Iosc will result in lower clock frequency and also lower power consumption. In summary, this invention provides on-chip high voltage with low power dissipation.

While the invention has been described in terms of the preferred embodiments, those skilled in the art will recognize that various changes in form and details may be made without departing from the spirit and scope of the invention.

What is claimed is:

1. A low power, high voltage ramp-up control circuit comprising:
    a current reference whose output goes to an adder,
    a current controlled oscillator whose input comes from said adder,
    a charge pump whose input comes from said current controlled oscillator,
    a first metal oxide semiconductor field effect, NMOS FET, which sinks feedback current from said adder and whose gate input comes from a low voltage node,
    a ramp capacitor, one side of which is connected to a high voltage node and whose other side is connected to said low voltage node,
    a ramp discharge NMOS FET whose drain receives a ramp current and whose gate is tied to a gate of a reference NMOS FET, and
    a reference current source whose output goes to a drain of said reference NMOS FET whose gate and drain are tied to said reference current source.

2. The low power, high voltage ramp-up control circuit of claim 1 wherein said current reference output is
    a constant reference current.

3. The low power, high voltage ramp-up control circuit of claim 1 wherein
    an oscillator current is developed in said adder.

4. The low power, high voltage ramp-up control circuit of claim 1 wherein said
    feedback current is developed in said adder.

5. The low power, high voltage ramp-up control circuit of claim 1 wherein
    a clock signal is developed as an output of said current controlled oscillator.

6. The low power, high voltage ramp-up control circuit of claim 1 wherein
    a high voltage signal is applied to said high voltage node.

7. The low power, high voltage ramp-up control circuit of claim 1 wherein said
    ramp current is developed through said ramp capacitor and said ramp discharge NMOS FET.

8. The low power, high voltage ramp-up control circuit of claim 1 wherein
    a reference current developed in said reference current source, flows through said reference NMOS FET.

9. The low power, high voltage ramp-up control circuit of claim 1 wherein a reference voltage is developed at the drain of said ramp discharge NMOS FET.

10. The low power, high voltage ramp-up control circuit of claim 1 wherein said current reference's output a constant current, feeds said adder.

11. The low power, high voltage ramp-up control circuit of claim 1 wherein said adder has one output called oscillator current, which feeds said current controlled oscillator and another output, providing said feedback current to the drain of said first NMOS FET.

12. The low power, high voltage ramp-up control circuit of claim 1 wherein said current controlled oscillator has a clock output, which drives said charge pump.

13. The low power, high voltage ramp-up control circuit of claim 1 wherein said charge pump provides a high voltage output on said high voltage node which drives said one side of said ramp capacitor.

14. The low power, high voltage ramp-up control circuit of claim 1 wherein said first NMOS FET has its drain connected to said adder, its source connected to ground, and its gate connected to the drain of said ramp discharge NMOS FET.

15. The low power, high voltage ramp-up control circuit of claim 1 wherein said ramp discharge NMOS FET has its drain connected to said other side of said ramp capacitor, its source connected to ground, and its gate connected to the gate and drain of said reference NMOS FET.

16. The low power, high voltage ramp-up control circuit of claim 1 wherein said reference NMOS FET has its source connected to ground.

17. A method of designing a low power, high voltage ramp-up control circuit comprising the steps of:
including a current reference whose output goes to an adder,
including a current controlled oscillator whose input comes from said adder,
including a charge pump whose input comes from said current controlled oscillator,
including a first metal oxide semiconductor field effect, NMOS FET, which sinks feedback current from said adder and whose gate input comes from a low voltage node,
including a ramp capacitor one side of which is connected to a high voltage node and whose other side is connected to said low voltage node,
including a ramp discharge NMOS FET whose drain receives a ramp current and whose gate is tied to a gate of a reference NMOS FET, and
including a reference current source whose output goes to a drain of said
reference NMOS FET whose gate and drain are tied to said reference current source.

18. The method of designing a low,power, high voltage ramp-up control circuit of claim 17 wherein said current reference output is
a constant reference current.

19. The method of designing a low power, high voltage ramp-up control circuit of claim 17 wherein
an oscillator current is developed in said adder.

20. The method of designing a low power, high voltage ramp-up control circuit of claim 17 wherein said
feedback current is developed in said adder.

21. The method of designing a low power, high voltage ramp-up control circuit of claim 17 wherein
a clock signal is developed as an output of said current controlled oscillator.

22. The method of designing a low power, high voltage ramp-up control circuit of claim 17 wherein
a high voltage signal is applied to said high voltage node.

23. The method of designing a low power, high voltage ramp-up control circuit of claim 17 wherein
said ramp current is developed through said ramp capacitor and said ramp discharge NMOS FET.

24. The method of designing a low power, high voltage ramp-up control circuit of claim 17 wherein
a reference current developed in said reference current source flows through said reference NMQS FET.

25. The method of designing a low power, high voltage ramp-up control circuit of claim 17 wherein
a reference voltage is developed at the drain of said ramp discharge NMOS FET.

26. The method of designing a low power, high voltage ramp-up control circuit of claim 17 wherein said current reference's output, a constant current, feeds said adder.

27. The method of designing a low power, high voltage ramp-up control circuit of claim 17 wherein said adder has one output called oscillator current, which feeds said current controlled oscillator and another output,providing said feedback current, to the drain of said first NMOS FET.

28. The method of designing a low power, high voltage ramp-up control circuit of claim 17 wherein said current controlled oscillator has a clock output, which drives said charge pump.

29. The method of designing a low power, high voltage ramp-up control circuit of claim 17 wherein said charge pump discharge high voltage output, on said high voltage node which drives said one side of said ramp capacitor.

30. The method of designing a low power, high voltage ramp-up control circuit of claim 17 wherein said first NMOS FET has its drain connected to said adder, its source connected to ground, and its gate connected to the drain of said ramp discharge NMOS FET.

31. The method of designing a low power, high voltage ramp-up control circuit of claim 17 wherein said ramp discharge NMOS FET has its drain connected to said other side of said ramp capacitor, its source connected to ground, and its gate connected to the gate and drain of said reference NMOS FET.

32. The method of designing a low power, high voltage ramp-up control circuit of claim 17 wherein said reference NMOS FET has its source connected to ground.

* * * * *

UNITED STATES PATENT AND TRADEMARK OFFICE
CERTIFICATE OF CORRECTION

| | |
|---|---|
| PATENT NO. | : 6,980,047 B1 |
| APPLICATION NO. | : 10/177856 |
| DATED | : December 27, 2005 |
| INVENTOR(S) | : Cheng-Hsiung Kuo |

It is certified that error appears in the above-identified patent and that said Letters Patent is hereby corrected as shown below:

Column 5, line 43, delete "capacitor" and insert therefore -- capacitor, --.

Column 6, line 21, delete "NMQS" and insert therefore --NMOS --.

Column 6, line 40, delete "discharge" and insert therefore -- provides a --.

Signed and Sealed this

Seventeenth Day of July, 2007

JON W. DUDAS
*Director of the United States Patent and Trademark Office*